(12) United States Patent
Johnson et al.

(10) Patent No.: US 9,406,653 B2
(45) Date of Patent: Aug. 2, 2016

(54) INTEGRATED SOLUTION FOR SOLID STATE LIGHT SOURCES IN A PROCESS CHAMBER

(71) Applicant: APPLIED MATERIALS, INC., Santa Clara, CA (US)

(72) Inventors: Joseph Johnson, Palo Alto, CA (US); Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 463 days.

(21) Appl. No.: 13/778,991

(22) Filed: Feb. 27, 2013

(65) Prior Publication Data

US 2014/0241707 A1 Aug. 28, 2014

(51) Int. Cl.
| | |
|---|---|
| *F26B 3/30* | (2006.01) |
| *H01L 25/075* | (2006.01) |
| *H01L 33/60* | (2010.01) |
| *H01L 33/64* | (2010.01) |

(52) U.S. Cl.
CPC ............. *H01L 25/0753* (2013.01); *H01L 33/60* (2013.01); *H01L 33/642* (2013.01); *H01L 2924/0002* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 6,740,906 B2 | 5/2004 | Slater, Jr. et al. | |
| 7,514,305 B1 | 4/2009 | Hawryluk et al. | |
| 7,977,258 B2 | 7/2011 | Nenyei et al. | |
| 8,404,499 B2 | 3/2013 | Moffatt | |
| 8,967,838 B1* | 3/2015 | Miller | 362/418 |
| 2003/0174517 A1* | 9/2003 | Kiraly et al. | 362/555 |
| 2007/0039942 A1 | 2/2007 | Leung et al. | |
| 2007/0233208 A1* | 10/2007 | Kurtz et al. | 607/88 |
| 2010/0267174 A1 | 10/2010 | Moffatt | |
| 2010/0309659 A1* | 12/2010 | Jenny | 362/228 |
| 2011/0151607 A1 | 6/2011 | Landis et al. | |
| 2012/0031332 A1 | 2/2012 | Yokota et al. | |
| 2012/0286308 A1 | 11/2012 | Lai et al. | |
| 2013/0026516 A1 | 1/2013 | Wang et al. | |

OTHER PUBLICATIONS

International Search Report and Written Opinion mailed May 28, 2014 for PCT Application No. PCT/US2014/015675.

* cited by examiner

*Primary Examiner* — Thor Campbell
(74) *Attorney, Agent, or Firm* — Moser Taboada; Alan Taboada

(57) ABSTRACT

Apparatus for providing pulsed or continuous energy in a process chamber, and methods of fabricated said apparatus, are provided herein. The apparatus may include a substrate having a plurality of electrical terminals disposed on one or more surfaces of the substrate, a plurality of solid state sources grown on top of the plurality of electrical terminals, the plurality of solid state sources providing pulsed or continuous energy when electrically powered, and one or more cooling channels formed in one or more areas of the substrate.

12 Claims, 5 Drawing Sheets

INTEGRATED SOLUTION FOR SOLID STATE LIGHT SOURCES IN A PROCESS CHAMBER

FIELD

Embodiments of the present invention generally relate to semiconductor processing systems and, more specifically, to energy sources for use in semiconductor processing systems.

BACKGROUND

Several applications that involve the thermal processing of substrates such as semiconductor wafers and other materials involve the process steps of rapidly heating and cooling a substrate. One example of such processing is rapid thermal processing (RTP), which is used for a number of semiconductor fabrication processes.

Rapid thermal processing (RTP) radiate heat energy from lamps into the process chamber and onto a semiconductor substrate in the processing chamber. In this manner, the substrate is heated to a required processing temperature. During semiconductor processing operations, the lamps operate at extremely high temperatures. Not all of the heat energy provided by the RTP chamber lamps end up actually heating the wafer. Some of the radiant energy is absorbed by chamber components, especially the reflective components in the radiation field. This is particularly true for emitted energy from point sources which emit light in all directions.

In addition, in the semiconductor industry, it is often desirable to obtain temperature uniformity in the substrate during temperature cycling of substrate. Temperature uniformity provides uniform process variables on the substrate (e.g. layer thickness, resistivity, etch depth) for temperature activated steps such as film deposition, oxide growth, and etching. Furthermore, temperature uniformity in the substrate is necessary to prevent thermal stress-induced substrate damage such as warpage, defect generation, and substrate slip.

To address the issues above, arrays of solid state sources (e.g., Light Emitting Diodes (LEDs), LASERs, and the like) have been used in some substrate processing chambers. However, arrays of solid state sources require a great deal of wiring, bonding, and thermal management. Difficulties in manufacturing arrays of solid state sources and the complexity of using arrays of solid state sources, among other reasons, have slowed wide spread adaptation of solid state source arrays for use in RTP processes and chambers.

Accordingly, the inventors have provided an integrated solution for solid state source array lighting and heating for semiconductor substrate processing and methods for manufacturing said integrated solution.

SUMMARY

Apparatus for providing pulsed or continuous energy in a process chamber, and methods of fabricated said apparatus, are provided herein. The apparatus may include a substrate having a plurality of electrical terminals disposed on one or more surfaces of the substrate, a plurality of solid state sources grown on top of the plurality of electrical terminals, the plurality of solid state sources providing pulsed or continuous energy when electrically powered, and one or more cooling channels formed in one or more areas of the substrate.

In some embodiments, methods of fabricating a solid state light source array may include depositing a first metallic layer on a one or more surfaces of a base substrate, depositing a first dielectric layer over the first metallic layer, etching a plurality of cavities in an exposed surface of the first layer of dielectric material to expose the metallic layer at the bottom of each of the plurality of cavities, depositing metallic material into each of the plurality of cavities to form electrical terminals, depositing a second dielectric layer over the plurality of cavities, etching cooling channels in one or more areas of the base substrate and growing a plurality of solid state light sources on top of the exposed electrical terminals.

In some embodiments, apparatus for providing pulsed or continuous energy in a process chamber of fabricating a solid state light source array may include a process chamber body of the semiconductor process chamber, one or more solid state source arrays to provide pulsed or continuous energy to the process chamber, wherein each of the one or more solid state source arrays includes a substrate having a plurality of electrical terminals disposed on one or more surfaces of the substrate, a plurality of solid state sources grown on top of the plurality of electrical terminals, the plurality of solid state sources providing pulsed or continuous energy when electrically powered, and one or more cooling channels formed in one or more areas of the substrate, and a power source coupled to the one or more solid state source arrays to electrically power the plurality of solid state sources.

Other embodiments and variations of the present invention are disclosed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
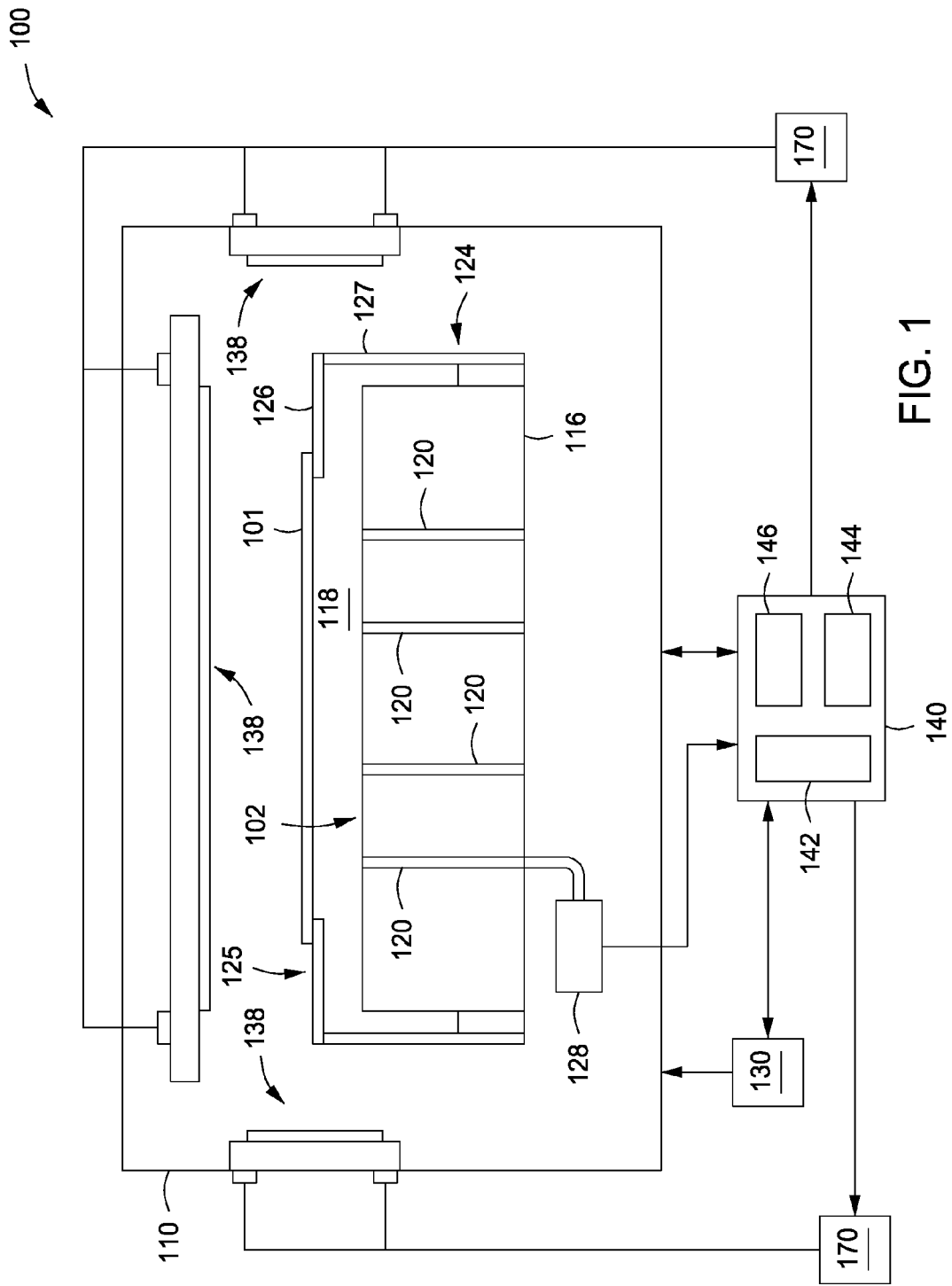
FIG. 1 is a schematic, cross-sectional view of a semiconductor substrate process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an integrated solution for solid state source array lighting and heating for semiconductor substrate processing, process gas activation/modification, and/or chamber conditioning, and methods for manufacturing said integrated solution for processing substrates, are provided herein. In some embodiments, the inventive apparatus may advantageously provide improved heating of substrates and other components disposed in a process chamber through the use of solid state source arrays.

In the following description, the term substrate is intended to broadly cover any object that is being processed in a thermal process chamber. The term substrate may include, for example, semiconductor wafers, flat panel displays, glass plates or disks, plastic workpieces, and the like. In the following description solid state light point sources include light emitting diodes (LEDs) and LASERs. In addition, although described below in terms of LEDs or arrays of LEDs, LASERs and arrays of LASERs, other solid state light point sources may be used interchangeably in embodiments described herein.

FIG. 1 depicts a schematic of an exemplary process chamber 100 configured to perform thermal processes, such as a rapid thermal process (RTP), and suitable for use with the inventive LED source for heating substrates in accordance with some embodiments of the present invention. The process chamber 100 may be any type of process chamber having a substrate support configured to support a substrate (e.g., process chamber that includes a substrate support ring, a susceptor which holds the substrate in multiple places, air jets that holds the substrate in place) and having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a light-emitting diode (LED) energy source 138, which may include a plurality of LEDs or array(s) of LEDs arranged in zones, wherein each zone of LEDs is separately controllable. In FIG. 1, LED energy sources 138 are shown above the substrate 101 for providing pulsed or continuous energy within process chamber 100. In some embodiments, LED energy sources 138 may be used for heating an upper surface of the substrate 101, and on each side of the substrate 101 (which may be used, for example, to heat edge ring 126 which contacts substrate 101). Alternatively, LED energy sources 138 may be configured to heat the back side, or both sides simultaneously, of the substrate 101, for example, such as by being disposed below the substrate 101, or by directing the radiation to the back side of the substrate 101. Each LED energy source 138 is coupled to one or more power sources 170 which may be coupled to controller 140 to separately control each LED energy source 138. The temperatures at localized regions of the substrate 101 are measured by a plurality of temperature probe assemblies, such as 120, that passes through a through a hole that extends from the back side of the base 116 through the top of a reflector plate 102. However, since the monochromatic properties of LEDs will not cause pyrometer interference, in some embodiments, temperature measurements may advantageously be obtained via pyrometers disposed anywhere in the chamber. The temperature probe assemblies 120 transmit sampled light from the reflecting cavity 118 to a pyrometer 128. The pyrometer 128 is connected to controller 140 which controls the power supplied to the lamp head 138 in response to a measured temperature. The LED energy sources 138LED energy sources 138 may be divided into multiple zones. The zones can be individually adjusted by the controller to allow controlled radiative heating of different areas of the substrate 101. In other embodiments, each LED in LED energy sources 138LED energy sources 138 may be separately controlled to facilitate even finer control of the radiative heating.

In some embodiments, a cooling mechanism may be used to cool the LED energy sources 138. Some exemplary cooling mechanisms may include, for example, the use of heat sinks coupled to or grown on (as discussed below) a backside of the LED energy sources 138. In some embodiments, the substrate on which the LEDs are mounted or grown on may itself be a heat sink used for cooling. In other embodiments, LED energy sources 138 may be cooled by a gas or liquid circulated around or proximate to the LED energy sources 138.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

During processing, the substrate 101 is disposed on the substrate support 124. The LED energy source 138 is a source of radiation (e.g., heat) and, in operation, generates a predetermined temperature distribution across the substrate 101. The LED energy source 138 may provide energy in wavelengths ranging from ultraviolet wavelengths to infrared wavelengths (e.g., about 10 nanometers (nm) to about 2000 nanometers (nm)). In some embodiments LED energy source 138 may provide energy in the microwave wavelength range. The LED Array 138 provides heat radiation that is absorbed by the substrate 101. Although some of the heat radiation produced by an LED source may be reflected, substantially all of the heat radiation that is not reflected is absorbed by the target component being heated. In embodiments described herein, the substrate 101 may bow, for example up to about 5 mm, during heating. Thus, in some embodiments, the LED energy source 138 should be placed just far enough away to avoid contact if the substrate 101 bows, but close enough to provide the necessary uniform heat energy to the target substrate. In some embodiments, the LED energy source 138 may be bowed or shaped to compensate for the target substrate deformation.

In the exemplary processing chamber 100 described above, LED energy source 138 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, LED arrays 138 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used to process the near surface region of a substrate. LEDs last a long time and allow the output intensity to be chosen independent from the wavelength(s) of the output illumination. Light emitting diodes (LEDs) may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even electronically excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In some embodiments, each LED energy source 138 in FIG. 1 may include one large array of LEDs. However, depending on the heat energy and area to be heated, one large array of LEDs may require more power than can safely be provided without damage to the LEDs and associated circuitry. The inventors have observed that by modularizing LEDS into a plurality of smaller LED arrays, the smaller LED arrays can be more easily handled, manufactured, and powered. In addition, a plurality of smaller arrays of LEDs may also help in the event of LED failure. For example, in some embodiments, if one led fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

Figure 2A:
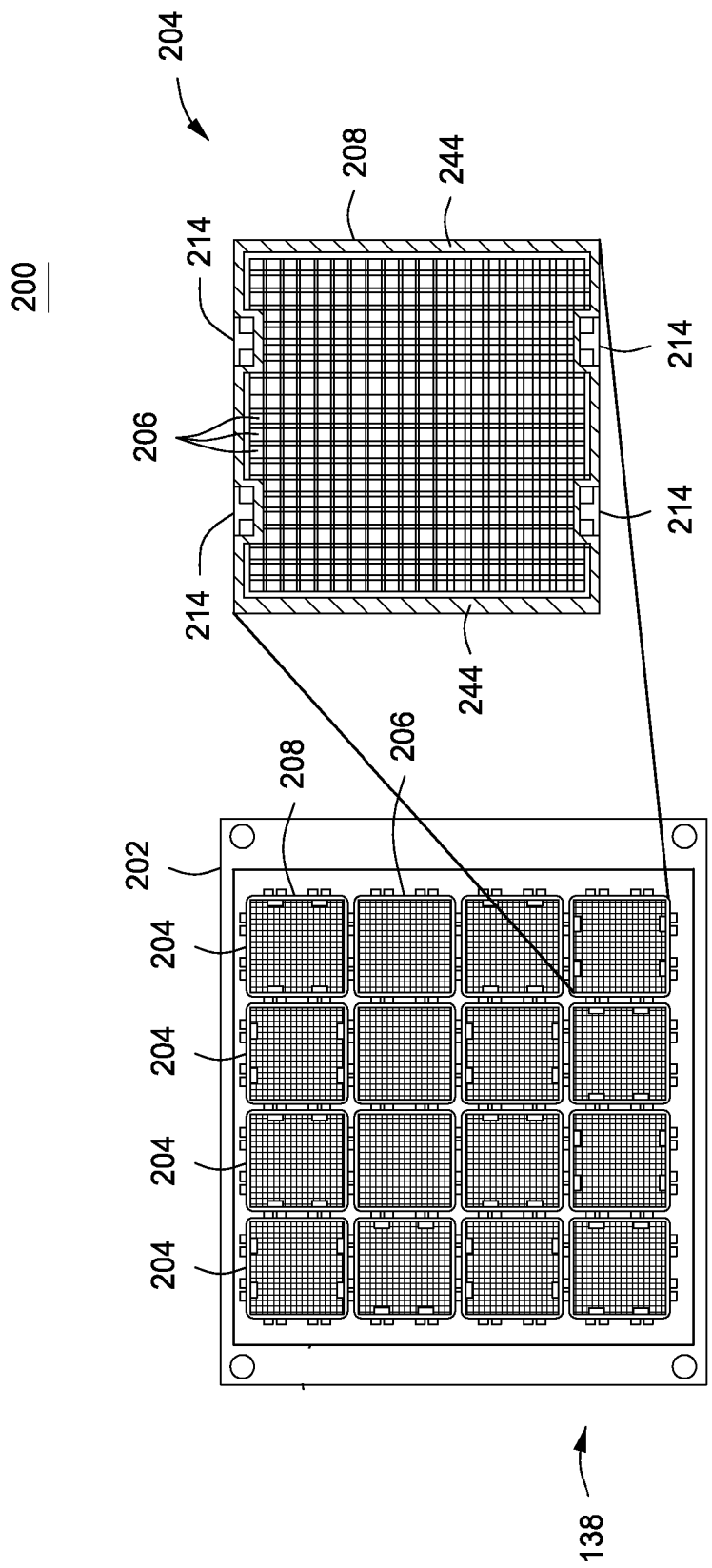
FIG. 2A is a top view of an solid state light source that includes a plurality of LED arrays in accordance with some embodiments of the present invention.
Figure 2B:
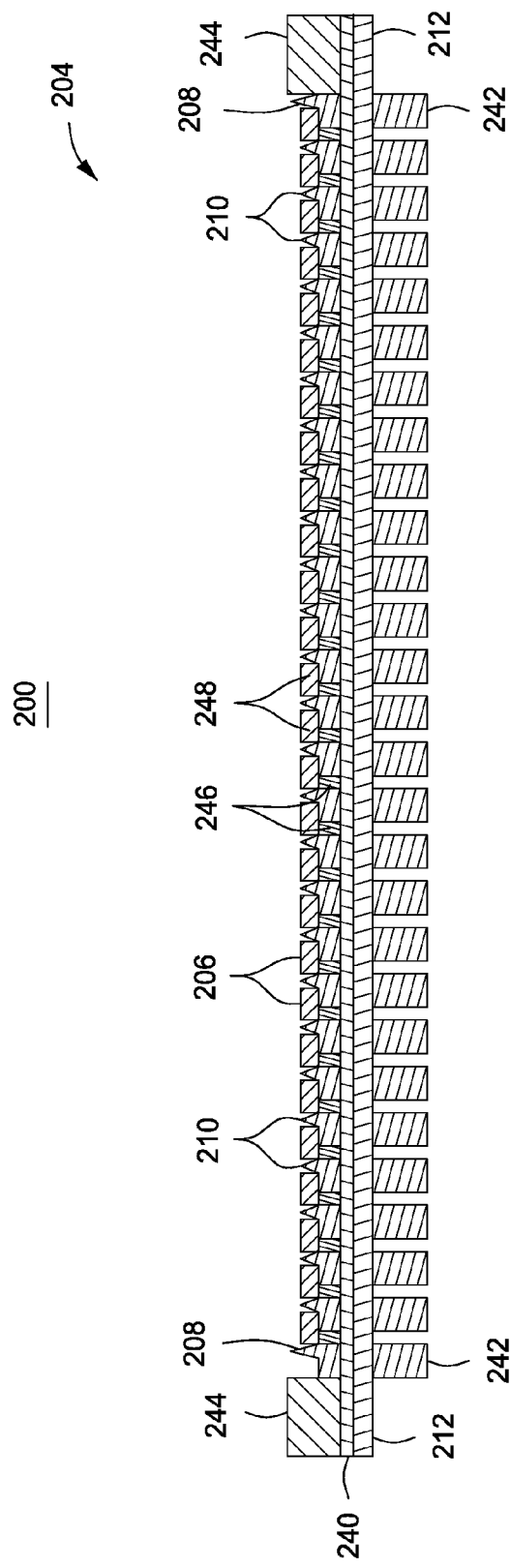
FIG. 2B is a side cross-sectional view of an solid state light source array in accordance with some embodiments of the present invention.

FIGS. 2A and 2B show at least one exemplary embodiment of an LED energy source 138 that includes a plurality of LED arrays 204 disposed on a LED substrate 202 for thermally processing other substrates and/or heating various processing chamber components disposed in the processing chamber.

In some embodiments, LED energy source 138 may illustratively be between 100 mm and 480 mm in length and between 100 mm and 480 mm in width. In addition, various size LED energy sources 138 may be used as required or desired in any particular application. In some embodiments, each LED array 204 may be about 20 mm by about 20 mm square, although other size LED arrays 204 may be used. Each LED array 204 may contain between about 300 and about 500 LEDs 206 (e.g., 384 LEDs as shown in FIG. 2B). LEDs 206 may be spaced between about 0.2 mm and about 1 mm apart. LED arrays 204 may be spaced between about 0.5 mm and about 4 mm apart.

Each LED 206 in LED arrays 204 may emit light and heat energy from one or more exposed surfaces. In some embodiments, all exposed surfaces of each LED 206 may emit light and heat energy. In some embodiments, each LED may be about 0.7 mm by about 0.7 mm square and about 0.3 mm in height, although other size LED 206 may be used.

In some embodiments, each LED array 204 may be an integrated solution 200 including a base substrate 212, a plurality of LEDs 206, reflectors 208 disposed on one or more sides of the LED array 204, reflectors 210 disposed on one or more sides of each LED 206, electrical contact terminals 214 that may be coupled to a power source to supply power to the LED array 204, an electrically conductive metallic layer 240, cooling channels 242, and an outer dam 244. In some embodiments, the integrated solution 200 may include all or some of the features described above. In addition, the integrated solution 200 may include other layers or deposited material to electrically isolate or electrically connect the features described above. For example, in some embodiments, the integrated solution 200 includes dielectric material layer 248 deposited over the electrically conductive metallic layer 240. The integrated solution 200 includes vias 246 formed in dielectric material layer 248 that may have an electrically conductive material deposited therein to electrically couple the LEDs 206 to the electrically conductive metallic layer 240.

In some embodiments, each LED 206 may be grown on base substrate 212 or on dialetric material layer 248. The LEDs 206 may be individually grown, grown in groups/sections, or grown all together at the same time. In some embodiments, the base substrate 212 and/or dialetric material layer 248 that LEDs 206 are grown on may be an n-type substrate, with an electrode (e.g., 214) attached to the p-type layer 240 deposited on its surface. Silicon substrates or sapphire substrates may be used as well. The substrate can be any material that is thin enough, or has a high thermal conductivity, such that it is able to dissipate heat from the LEDs quickly while also providing electrical isolation of the LEDs from the rest of the system. This can be done by using an electrically isolating material. LEDs can be grown on any material where the lattice structure of the substrate can be made to match the lattice structure of the LED material through, but not limited to, direct deposition, application of a buffer layer, and/or any type of stress relaxation. In some exemplary embodiments, the substrate can be ceramic. In some embodiments, islands of non-substrate material/chemistries may be grown or included in the substrate to help facilitate LED growth. In some embodiments, the solid state sources can be placed or mounted on the substrate as opposed to growing the solid state sources.

In some embodiments, LEDs 206 may be grown on both a top surface and bottom surface of the base substrate 212. Cooling channels may be formed through the center of the base substrate 212 or between LEDs 206 on the top and bottom surfaces.

In some embodiments, the reflectors 208, 210 are configured reflect the light and heat energy emitted from the LED towards the desired target (e.g., substrate, or other process chamber component, etc.). In the case of LASERS, the reflectors 208, 210 could direct the light off of the LASER beams' axis to heat a wafer substrate or desired process chamber component. The reflectors 208 and 210 may be angled to reflect radiated LED light in a desired direction. In some embodiments, the angles of the incline of the reflector surfaces from the LED substrate 202 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210 may be perpendicular to the surface of the LED substrate 202. Still, in other embodiments, the surface of the LEDs 206 may be angled instead of, or in addition to, the surface of the reflector. In some embodiments, the height of the reflectors 208, 210 is at least the same height as the height of the LEDs 206, but may be higher or lower than the LEDs 206 as required.

In some embodiments, reflectors 208 and 210 may be formed from an additional layer of material deposited over the dialetric material layer 248 and vias 246 formed in dialetric material layer 248. The additional layer of material that the reflectors 208, 210 are formed from may be a layer of silicon. Reflectors 208, 210 may be formed between each LED 206 and each neighboring LED 206 to direct the light and heat energy provided by the LED and the neighboring LED towards the desired target. In other embodiments, reflectors 208 and 210 may be formed around the periphery of a group of LEDs 206 and/or around the periphery of LED array 204. In some embodiments, the reflectors 208, 210 may be formed by, but not limited to, potassium hydroxide (KOH) etching of a silicon layer deposited over the dialetric material layer 248 and vias 246. The KOH etches the silicon layer along its crystal structure and forms holes in a desired shaped. In some embodiments, the KOH etches the silicon layer into inverted pyramid structures. In some embodiments, the reflectors 208, 210 may be coated with a reflective surface.

Figure 3:
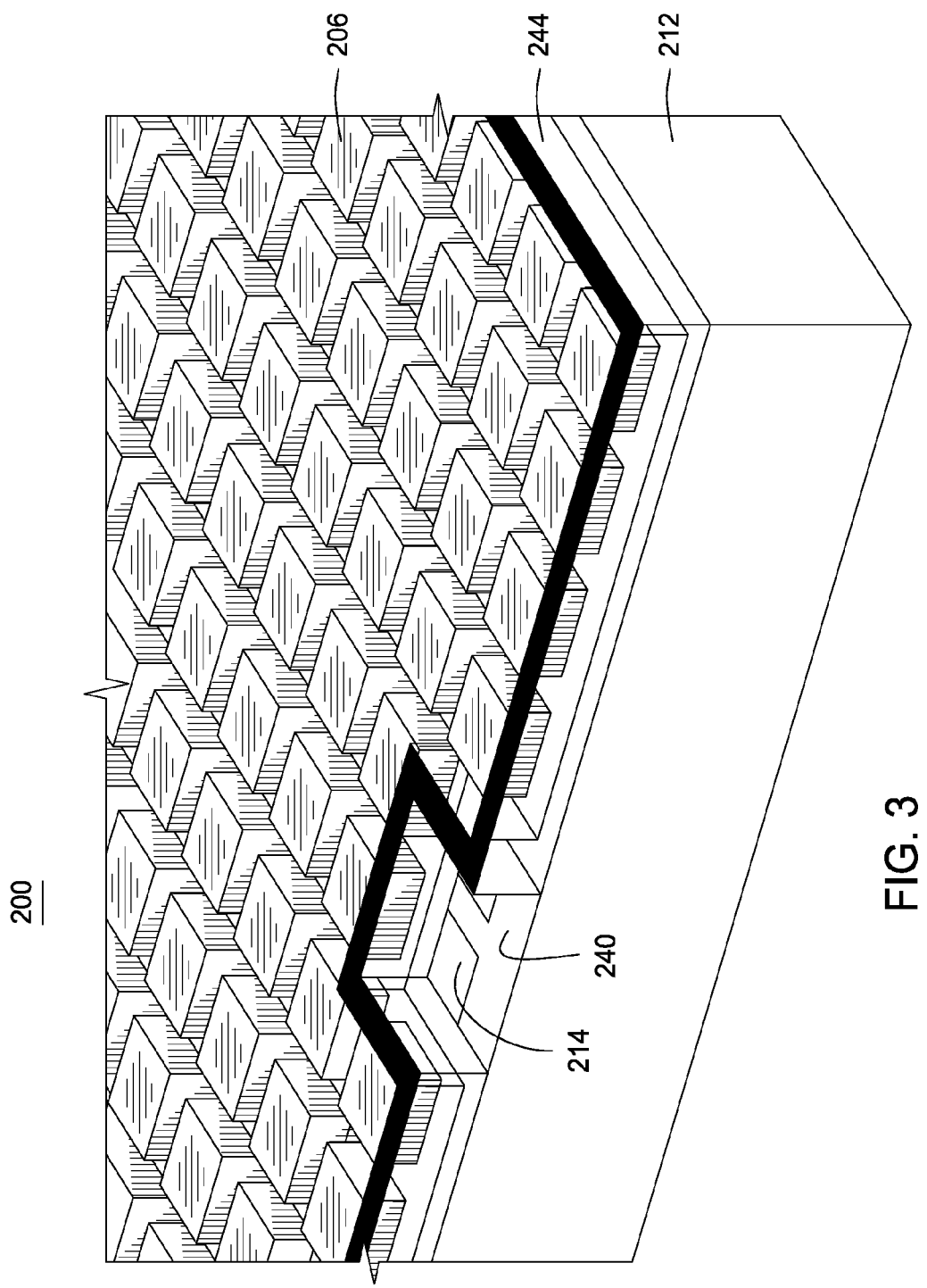
FIG. 3 is a three dimensional view of an LED array including a plurality of LEDs an outer dam in accordance with some embodiments of the present invention.

As described above, in some embodiments, the integrated solution 200 may include an outer dam 244 as shown in FIGS. 2A, 2B and 3. As shown in FIG. 3, in some embodiments, the outer dam 244 may be formed from a translucent material used to contain encapsulation material, such as an epoxy material that may be used to encapsulate the LED array 204. The translucent outer dam 244 allows for light to pass through and holds encapsulation material over the LEDs 206 while keeping electrical contact terminals 214 free from the encapsulation material. In some embodiments, the outer dam 244 may be formed using a machine that prints the outer dam 244 onto the integrated solution 200. In some embodiments, the outer dam may be about 0.5 mm high and 0.25 mm wide surrounding the LED array 204. In some embodiments, the outer dam 244 will be printed in a pattern that allows electrical contact terminals 214 to be exposed to air and not contained by the outer dam 244 itself.

LEDs on typical solid state source arrays are grown, cut out individually, and mounted to a substrate. Embodiments of the integrated solution 200 described above, and the methods for manufacturing those embodiments of the integrated solution 200 as described below, advantageously eliminate the solder/wire bonding process of attaching/mounting LEDs 206 to a substrate. As described above, the integrated solution 200 may also incorporate reflectors 208, 210 and cooling channels 242. Thus, the manufacturing of integrated solution 200 combines, or otherwise make unnecessary, many the manufacturing process, thereby eliminating much of the manufacturing error in making and using solid state light source arrays. As such, embodiments of the present invention advantageously eliminates many imprecise manufacture processes, saves room, and better manages cooling of solid state light source arrays.

Figure 4:
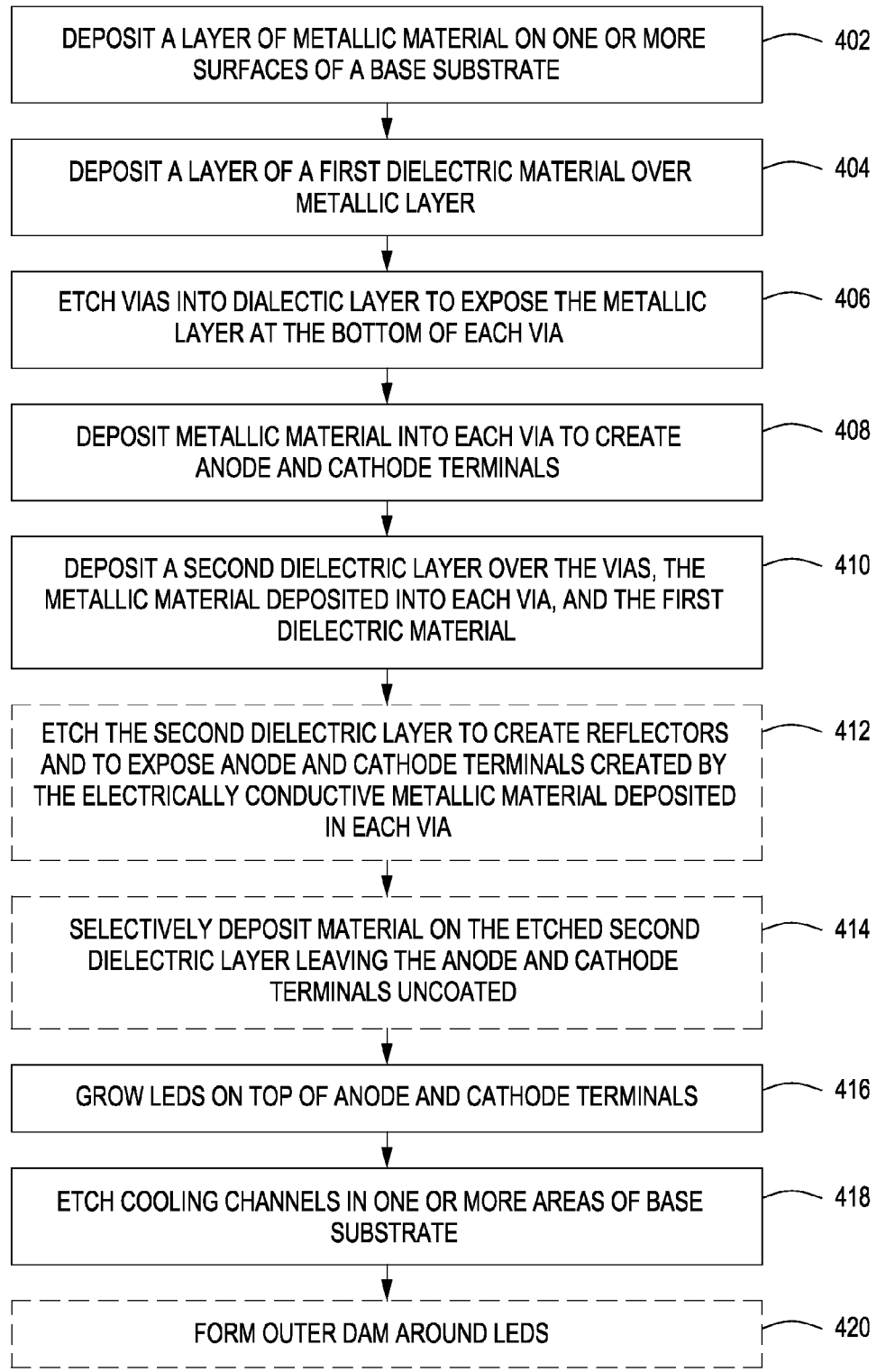
FIG. 4 depicts a flow chart for a method of fabrication of a solid state light source in accordance with some embodiments of the present invention.

FIG. 4 is a flow chart of a method for manufacturing embodiments of the integrated solution 200. In exemplary embodiments consistent with the present invention, a base substrate 212 may have a metallic layer 240 deposited on one or more surfaces of the base substrate 212 at 402. In some embodiments, the metallic layer 240 may be formed from copper, aluminum, nickel, tungsten, zinc, silver, and the like. The metallic layer 240 may be processed to form traces of metallic material to form the electrical circuit for delivering power to the LEDs 206. At 404, a first dielectric layer 248 may be deposited over the metallic layer 240. At 406, vias 246 may be etched in dielectric layer 248 such that the metallic layer 240 is exposed at the bottom of each via 246. An electrically conductive metallic material (e.g., copper) may be deposited at 408 in each via 246 to create positive and negative terminals for the LEDs 206. At 410, a second dielectric layer is deposited over the vias 246, the metallic material deposited into each via, and the first dielectric material 248. In some embodiments, the second dielectric layer may be formed as described above with respect to base substrate 212 and dielectric material layer 248. At 412, the second dielectric layer is etched to expose anode and cathode terminals created by the electrically conductive metallic material deposited at 408 in each via 246. In some embodiments, the second dielectric layer may also be etched to create reflectors 208, 210. In other embodiments, the reflectors 208, 210 may be formed by depositing silicon that could be KOH etched to form reflectors.

The reflectors 208, 210 would then be coated with a reflective surface coating at 414. In some embodiments, the wavelength of the LEDs 206 used may be between about 400-500 nanometers. At these wavelengths, aluminum (AL) and silver (Ag) reflect about 90% of the light emitted from the LEDs 206. Thus, at 414, aluminum or silver may optionally be selectively deposited as the reflective surface coating on the etched second dielectric layer, leaving the anode and cathode terminals uncoated. However, at different LED wavelengths, different materials (other than aluminum (AL) or silver (Ag)) will be better reflectors. Thus, in some embodiments, the material deposited at 414 may be based on the wavelength of the LEDs 206 used and selected to improve reflectivity of the reflector. In addition, since different materials absorb energy at different rates, when a substrate is being processed, certain parts of the substrate would heat up quicker than others. Thus, as used above, selectively depositing the reflective coating refers to depositing a reflective material that is only activated above a certain temperature. Therefore, the parts of the substrate that had heated up more quickly would be the only places where the reflective material would be deposited.

At 416, the LEDs 206 may be grown on top of the anode and cathode terminals. At 418, cooling channels are etched in one or more areas of the base substrate. At 420, an outer dam 244 may optionally be formed around the array 204 of LEDs 206.

While the foregoing is directed to embodiments of the present invention, other and further embodiments of the invention may be devised without departing from the basic scope thereof.

The invention claimed is:

1. An apparatus for providing pulsed or continuous energy in a semiconductor process chamber, the apparatus comprising:
   a substrate having a plurality of electrical terminals disposed on one or more surfaces of the substrate, wherein the substrate includes:
      a base substrate layer;
      a first metallic layer formed on a top surface of the base substrate layer;
      a first dielectric layer disposed over the first metallic layer; and
      a plurality of cavities formed in the first dielectric layer that expose the first metallic layer at a bottom of each cavity, wherein the plurality of cavities are filled with a metallic material to form the plurality of electrical terminals;
   a plurality of solid state sources grown on top of the plurality of electrical terminals, the plurality of solid state sources providing pulsed or continuous energy when electrically powered; and one or more cooling channels formed in one or more areas of the substrate.

2. The apparatus of claim 1, the apparatus further comprising:
one or more reflectors disposed on the one or more surfaces of the substrate, proximate to one or more of the plurality of solid state sources, to direct the pulsed or continuous energy provided by the one or more of the plurality of solid state sources towards a target component.

3. The apparatus of claim 2, wherein the substrate further comprises:
a second dielectric layer disposed over the plurality of cavities and the first dielectric layer, wherein the one or more reflectors are formed in second the dielectric layer.

4. The apparatus of claim 3, wherein the second dielectric layer includes cavities that expose the plurality of electrical terminals.

5. The apparatus of claim 4, wherein the substrate further comprises:
a second metallic layer selectively disposed over the second dielectric layer, wherein the plurality of electrical terminals are exposed on the one or more surfaces of the substrate.

6. The apparatus of claim 5, wherein the second metallic layer is formed from a material selected based on the material's ability to reflect specific wavelengths of light produced by the plurality of solid state sources.

7. The apparatus of claim 4, wherein the plurality of solid state sources are grown on a top surface of the substrate, and wherein the one or more cooling channels are formed on a bottom surface of the substrate.

8. The apparatus of claim 2, further comprising:
an outer dam formed along the periphery of the plurality of solid state sources.

9. The apparatus of claim 8, wherein the outer dam is translucent acrylic and configured to contain an epoxy poured over each of the plurality of solid state sources and the one or more reflectors.

10. The apparatus of claim 2, wherein the one or more reflectors includes a plurality of reflectors, and wherein the plurality of reflectors are disposed about a periphery of each of the plurality of the solid state sources.

11. The apparatus of claim 1, wherein each of the plurality of solid state sources are one of light emitting diodes (LEDs) or LASERS.

12. An apparatus for providing pulsed or continuous energy in a semiconductor process chamber, the apparatus comprising:
a process chamber body of the semiconductor process chamber;
one or more solid state source arrays providing pulsed or continuous energy to the process chamber, wherein each of the one or more solid state source arrays include:
a substrate having a plurality of electrical terminals disposed on one or more surfaces of the substrate, wherein the substrate includes:
a base substrate layer;
a first metallic layer formed on a top surface of the base substrate layer;
a first dielectric layer disposed over the first metallic layer; and
a plurality of cavities formed in the first dielectric layer that expose the first metallic layer at a bottom of each cavity, wherein the plurality of cavities are filled with a metallic material to form the plurality of electrical terminals;
a plurality of solid state sources grown on top of the plurality of electrical terminals, the plurality of solid state sources providing pulsed or continuous energy when electrically powered; and
one or more cooling channels formed in one or more areas of the substrate; and
a power source coupled to the one or more solid state source arrays to electrically power the plurality of solid state sources.

* * * * *